United States Patent [19]

Jungwirth

[11] Patent Number: 4,987,334
[45] Date of Patent: Jan. 22, 1991

[54] PIEZOELECTRIC DITHER MOTOR

[75] Inventor: Douglas R. Jungwirth, Reseda, Calif.

[73] Assignee: Northrop Corporation, Hawthorne, Calif.

[21] Appl. No.: 394,787

[22] Filed: Aug. 15, 1989

[51] Int. Cl.$^5$ .............................................. H01L 41/08
[52] U.S. Cl. .................................... 310/333; 310/328; 310/323; 356/350
[58] Field of Search .............. 310/321, 323, 328, 330, 310/331, 332, 333, 369; 356/350

[56] References Cited

U.S. PATENT DOCUMENTS

| | | | |
|---|---|---|---|
| 2,488,586 | 11/1949 | Diemer | 310/333 |
| 2,686,882 | 8/1954 | Mallinckrodt | 310/815 |
| 3,211,931 | 10/1965 | Tehon | 310/313 |
| 3,573,960 | 6/1971 | Duncan | 310/333 |
| 4,160,184 | 7/1979 | Ljung | 310/328 |
| 4,180,892 | 1/1980 | Jenson | 310/333 |
| 4,210,837 | 7/1980 | Vasiliev et al. | 310/333 X |
| 4,211,951 | 7/1980 | Jensen | 310/333 |
| 4,349,183 | 9/1982 | Wirt et al. | 310/328 |
| 4,392,935 | 8/1982 | Kallmeyer et al. | 310/328 |
| 4,453,103 | 6/1984 | Vishneusky et al. | 310/323 |
| 4,523,120 | 1/1985 | Assard et al. | 310/323 |
| 4,565,941 | 1/1986 | Ridgway et al. | 310/328 |

FOREIGN PATENT DOCUMENTS

| | | | |
|---|---|---|---|
| 0076184 | 5/1984 | Japan | 310/328 |
| 0020775 | 2/1985 | Japan | 310/323 |
| 0059980 | 4/1985 | Japan | 310/323 |
| 0084890 | 5/1985 | Japan | 310/328 |
| 278274 | 5/1971 | U.S.S.R. | |
| 604058 | 4/1978 | U.S.S.R. | |

Primary Examiner—Mark O. Budd
Attorney, Agent, or Firm—Terry J. Anderson; Robert B. Block

[57] ABSTRACT

Dither motor apparatus for oscillating a structure, such as a laser gyroscope 10, about a dither axis "A". The dither motor apparatus includes a support 18 that passes through an opening 16 within the gyroscope. The apparatus further includes a plurality of piezoelectric elements 22 individual ones of which are interposed between an outer surface of the support and an inner surface of the opening such that an outer surface of each of the elements is rigidly coupled to the inner surface of the opening and an inner surface of each of the elements is rigidly coupled to the outer surface of the support. The apparatus further includes a source 24 of alternating current coupled to electrodes 26 for energizing the plurality of piezoelectric elements for causing each of the elements to shear such that the outer surface of each of the elements rotates alternately clockwise and counter-clockwise with respect to the inner surface of each of the elements, thereby imparting an oscillatory motion to the gyroscope about the dither axis.

9 Claims, 1 Drawing Sheet

PIEZOELECTRIC DITHER MOTOR

FIELD OF THE INVENTION:

This invention relates generally to ring laser gyroscope (RLG) apparatus and, in particular, relates to a RLG dither motor mechanism comprised of lead zirconate titanate (PZT) or equivalent piezoelectric material poled in a shear mode.

BACKGROUND OF THE INVENTION:

The avoidance of mode locking in laser gyroscopes through the use of mechanically vibrated or individually dithered mirrors in known in the art. Mode locking is the tendency of two counter rotating beams of ring laser radiation to appear to have the same frequency at low levels of angular velocity due to noise or light scattering, thus causing a loss of a desired beat frequency. It is also known in the art to dither or rotate the entire laser gyroscope to prevent mode locking.

For example, in U.S. Pat. No. 4,349,183 there is shown a RLG dither mechanism comprised of a plurality of flexure springs bent by PZT crystals. Each spring has two PZT wafers attached to opposite faces of the spring on a hub side of an axis of inflection and two additional PZT wafers attached to opposite faces on a rim side of the axis of inflection. In U.S. Pat. No. 4,565,941 a RLG dither mechanism is comprised of two wheel shaped flexural elements having PZT material attached to each spoke.

These conventional RLG dither mechanisms can in general be characterized as having a significant degree of mechanical complexity and, therefore, experience those disadvantages inherent in such complexity.

It is thus an object of the invention to provide a reduction in structural complexity, weight and cost in a RLG dither mechanism.

It is a further object of the invention to provide for a RLG dither mechanism that includes piezoelectric material and which achieves high resonant frequencies and a high Q.

It is another object of the invention to provide for a RLG dither mechanism that includes piezoelectric material and which further permits a resonant frequency of the mechanism to be changed without requiring that the mechanical structure also be changed.

It is a still further object of the invention to provide a stiff structure for coupling a laser gyroscope to a mount to minimize compliance of the gyroscope. As used herein compliance is an amount of tilt experienced by the gyroscope rotational axis in response to a horizontal acceleration.

SUMMARY OF THE INVENTION

The foregoing problems are overcome and the objects of the invention are realized by dither motor apparatus for oscillating a structure such as a laser gyroscope about an axis. In an illustrative embodiment a support passes though an opening within a gyroscope. The apparatus includes a plurality of piezoelectric elements individual ones of which are interposed between an outer surface of the support and an inner surface of the opening such that an outer surface of each of the elements is rigidly coupled to the inner surface of the opening and an inner surface of each of the elements is rigidly coupled to the outer surface of the support. The apparatus further includes terminals for coupling to a source of alternating current, the terminals including an opposing pair of electrodes for energizing the piezoelectric element. When energized the element shears such that the outer surface of the element is laterally translated alternately clockwise and counter-clockwise with respect to the inner surface of the element, thereby imparting an oscillatory motion to the gyroscope about the dither axis.

BRIEF DESCRIPTION OF THE DRAWING

The above set forth and other features of the invention will be made more apparent in the ensuing Detailed Description of the Invention when read in con]unction with the attached Drawing, wherein.

DETAILED DESCRIPTION OF THE INVENTION

Figure 1A:
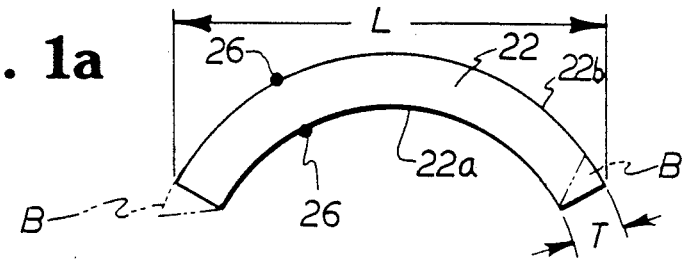
FIG. 1a a top view and FIG. 1b is an end view showing the general shape of a PZT element for use in the dither motor apparatus of the invention.

Referring to the FIGURES there is shown a RLG 10 that includes a body 12 having a generally triangular shape having mirrors 14a, 14b, 14c mounted at apexes of the triangle. RLG 10 includes a centrally disposed circular opening 16 through which a circular cylindrical mounting support or post 18 is disposed. Mounting post 18 is coupled to an underlying support 20. A dither axis, designated by the letter "A", is disposed substantially through the center of the post 18 along a longitudinal axis thereof. In operation the RLG 10 oscillates about the dither axis. The details of construction of the RLG 10 are not germane to an understanding of the invention and will not be further described herein. Of course, the invention is applicable to controllably oscillating structure other than a laser gyroscope and is also applicable to structure having a shape other than the specific shape illustrated.

Figure 2A:
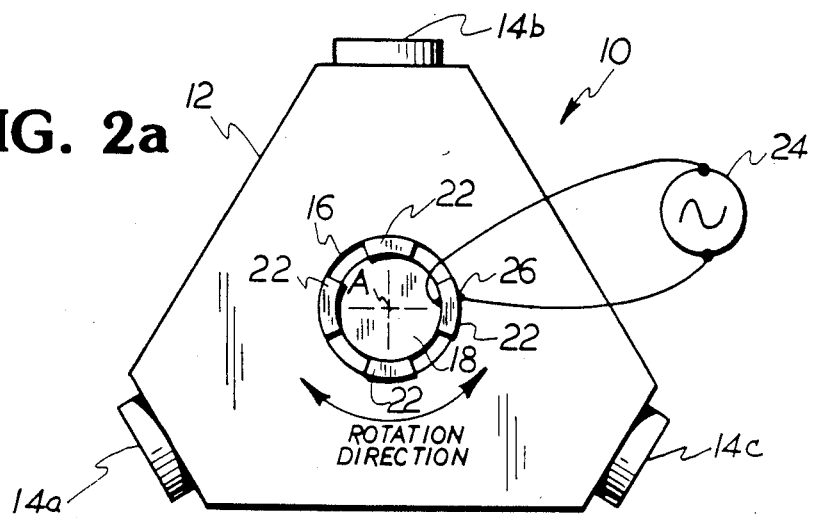
FIG. 2a is a top view and FIG. 2b is a side view of a RLG coupled with the dither motor apparatus of the invention.
Figure 2B:
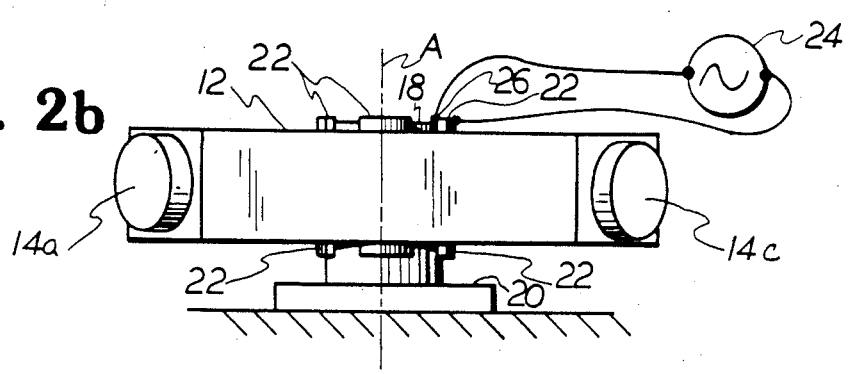

In accordance with the invention the RLG 10 is given an oscillatory motion about the dither axis "A" by a dither motor apparatus comprised of at least one piezoelectric pole element interposed between an inner surface of the opening 16 and the post 18. Preferably a plurality of the piezoelectric pole elements 22 are coupled via electrodes 26 to a source 24 of alternating current. In FIGS. 2a and 2b only one of the elements 22 is shown so coupled, it being understood that each of the elements 22 is coupled to the source 24.

Figure 1B:
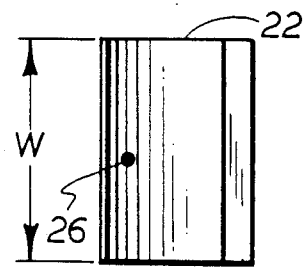

As can be seen in greater detail in FIGS. 1a and 1b the pole material is poled in the $d_{15}$ mode (shear mode) along the length (L) and is fabricated to have a shape that conforms to both the inner curvature of the RLG mounting opening 16 and to the outer curvature of the mounting post 18. The electrodes 26 are fabricated in known fashion on the inner surface 22a and the outer surface 22b of the pole element 22.

Representative approximate dimensions of the pole element 22 are a length (L) of 1.0 inch, a width (W) of 0.5 inch and a thickness (T) of 0.125 inch. The element 22 has a resonant frequency of 5000 Hertz when driven with a frequency source having a peak to peak amplitude of approximately 300 volts to approximately 400 volts. The material that comprises the pole element 22, for a presently preferred embodiment of the invention, is PZT material having a piezoelectric constant of approximately $670 \times 10^{-12}$ meter/volt ($d_{15}$). It should be realized though that other piezoelectric materials having other piezoelectric constants may be employed in the construction of the dither motor of the invention. The piezoelectric material is poled in the $d_{15}$ mode in a known manner by applying an electrical field to the piezoelectric material.

During construction of the RLG 10 structure the PZT pole elements 22 are preferably equidistantly spaced from one another about a circumference of the mounting post 18 and are rigidly fixed in place. The elements 22 may be fixed in place with an adhesive interposed between the inner surface 22a and the outer surface of the mounting post 18. The RLG body 12 is subsequently rigidly adhered to the exposed outer surfaces 22b of the PZT pole elements 22.

In operation an AC signal applied to the electrodes 26 causes each of the PZT pole elements to shear such that the outer surface 22b, the RLG 10/element 22 interface, is displaced laterally with respect to the inner surface 22a, the mounting post 18/element 22 interface. The dashed outline shown in FIG. 2a as "B" illustrates this relative motion of the outer surface 22b in response to a positive applied voltage. A relative motion in the opposite direction, not shown, is experienced due to a negative applied voltage. This bidirectional lateral displacement of the outer surface 22b results in an oscillation alternately clockwise and counterclockwise of the RLG body 12 about the post 18. The frequency of oscillation is a function of the stiffness of the PZT pole elements 22 and the physical geometry of the RLG 10. The overall stiffness of the PZT dither motor is a function of the number and the thickness of the individual PZT pole elements 22. The frequency of the AC signal is selected to coincide with the natural resonant frequency of the PZT pole elements 22 and the RLG body 12.

An AC signal applied to the electrodes 26 causes RLG 10 to dither, or oscillate, about the dither axis "A" at a frequency substantially equal to the frequency of the AC signal. Due to the inherent high stiffness of the PZT material gyro compliance is minimized and resonant frequencies of 1.5 KHz to 15 KHz are readily achieved. Also, by varying the thickness and/or number of PZT pole elements 22 the resonant frequency is precisely controlled.

It can be appreciated that the dither motor mechanism of the invention is relatively simple in construction and operation as compared to mechanisms of the prior art. Furthermore, the dither motor mechanism of the invention has a high Q, a high resonant frequency and is readily adjusted in frequency without requiring mechanical modifications of the RLG or mounting structure.

Thus, while the invention has been particularly shown and described with respect to a preferred embodiment thereof, it will be understood by those skilled in the art that changes in form and details may be made therein without departing from the scope and spirit of the invention.

What is claimed is:

1. In a laser gyroscope having an opening therethrough and a dither axis passing through the opening about which the gyroscope is oscillated, dither motor apparatus for oscillating the gyroscope about the dither axis comprising in combination:
   support means passing through the opening;
   a plurality of piezoelectric elements interposed between an outer surface of said support means and an inner surface of the opening, an outer surface of each of said elements being rigidly coupled to the inner surface of the opening and an inner surface of each of the elements being rigidly coupled to the outer surface of the support means; and
   means for energizing said plurality of piezoelectric elements for causing each of said elements to shear such that the outer surface of each of the elements rotates alternately clockwise and counter-clockwise with respect to the inner surface of each of the elements, thereby imparting an oscillatory motion to the gyroscope.

2. Dither motor apparatus as set forth in claim 1 wherein said means for energizing comprises a first electrode conductively coupled to the inner surface of each of the elements and a second electrode conductively coupled to the outer surface of each of the elements, said means for energizing further comprising a source of alternating current coupled across said first and said second electrodes.

3. Dither motor apparatus as set forth in claim 1 wherein each of said piezoelectric elements is poled in $d_{15}$ mode.

4. Dither motor apparatus as set forth in claim 1 wherein each of said piezoelectric elements is poled in a shear mode and wherein the inner and the outer surface of each of said elements is shaped to substantially conform to the shape of the surface to which element surface is rigidly coupled.

5. Dither motor apparatus as set forth in claim 4 wherein the opening is substantially circular in shape and wherein said support means is comprised of a circular cylindrical structure.

6. Dither motor apparatus as set forth in claim 5 wherein said plurality of piezoelectric elements are substantially equidistantly spaced one from another about a circumference of said support means.

7. In a laser gyroscope having a body intersected by a dither axis,
   means in said body forming an opening therein surrounding said dither axis,
   a support post passing through said opening,
   piezoelectric means interposed between the support post and the means forming the opening and rigidly attached to each, so that said gyroscope is fixedly supported by said support post and piezoelectric means except for movement generated by the latter,
   means for connecting an alternating current to said piezoelectric means element to cause the same to shear and thereby oscillate back and forth in response to said current, so carrying the gyroscope in oscillatory, dithering movement about said support post.

8. A pole element as set forth in claim 7 wherein said piezoelectric material is comprised of PZT material poled in a $d_{15}$ mode.

9. In a laser gyroscope having a body intersected by a dither axis,
   means in said body forming an opening therein surrounding said dither axis,
   a support post passing through said opening,
   a piezoelectric element having first and the second surfaces shaped to conform to and interposed between the support post and the means forming the opening and rigidly attached to each, so that said gyroscope is fixedly supported by said support post and piezoelectric element except for movement generated by the latter, a first electrode conductively coupled to said first surface of said piezoelectric element and said second electrode conductively coupled to a second surface of said piezoelectric element, terminal means for connecting an alternating current to said piezoelectric element electrodes to cause the same to shear and thereby oscillate back and forth in response to said current, so carrying the gyroscope in oscillatory dithering movement about said support post.

* * * * *